(12) United States Patent
Borrelli et al.

(10) Patent No.: US 6,320,366 B1
(45) Date of Patent: *Nov. 20, 2001

(54) METHOD OF MEASURING A LARGE CURRENT USING A GLASS FIBER CURRENT SENSOR

(75) Inventors: Nicholas F. Borrelli, Elmira, NY (US); Yves A H Brocheton, Fontenay-sous-Bois (FR); Lauren K. Cornelius, Painted Post, NY (US); Paul L. Netter, Paris (FR); Daniel L G Ricoult, Palaiseau (FR); Paul A. Tick, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/349,374

(22) Filed: Jul. 8, 1999

Related U.S. Application Data

(60) Provisional application No. 60/116,706, filed on Jan. 22, 1999.

(30) Foreign Application Priority Data

Jan. 5, 1999 (EP) .................................................. 994000164

(51) Int. Cl.$^7$ .................................................. G01R 31/00
(52) U.S. Cl. .............................................................. 324/96
(58) Field of Search ................................ 324/96; 65/397; 501/35, 37

(56) References Cited

U.S. PATENT DOCUMENTS

| | | | |
|---|---|---|---|
| 4,253,061 | * | 2/1981 | Ono et al. ............................... 324/96 |
| 4,560,867 | * | 12/1985 | Papuchon et al. ...................... 324/96 |
| 4,894,608 | * | 1/1990 | Ulmer, Jr. ............................... 324/96 |
| 5,136,235 | * | 8/1992 | Brandle et al. ......................... 324/96 |
| 5,272,434 | * | 12/1993 | Meyrueix et al. ...................... 324/96 |
| 5,365,175 | * | 11/1994 | Patterson et al. ....................... 324/96 |
| 6,133,721 | * | 10/2000 | Borrelli et al. ......................... 324/96 |

OTHER PUBLICATIONS

Yamashita, T., et al.; *Extremely Small Stress–Optic Coefficient Glass Single Mode Fibers for Current Sensor*; pp. 168–171.

Optical Properties of Glass, Donald R. Uhlmann and Norbert J. Kreidl, "Optical Properties of Halide Glasses", Jacques Lucas and Jean–Luc Adam, pp. 37–85.

* cited by examiner

*Primary Examiner*—Safet Metjahic
*Assistant Examiner*—Jermele M. Hollington
(74) *Attorney, Agent, or Firm*—Philip G. Allen

(57) ABSTRACT

A method of determining the magnitude of an exceptionally large current which comprises measuring the angle of rotation of polarized light in a magnetic field created by the current with a glass fiber sensor composed of a fluoride glass having a low Verdet constant and a photoelastic coefficient not over about 0.25 (nm/cm)/(kg/cm$^2$).

3 Claims, 1 Drawing Sheet

METHOD OF MEASURING A LARGE CURRENT USING A GLASS FIBER CURRENT SENSOR

This application claims the benefit of priority under 35 U.S.C. §119 from the European Patent Application Number 99400016.4, filed Jan. 5, 1999 and U.S. provisional application Ser. No. 60/116,706, filed Jan. 22, 1999.

FIELD OF THE INVENTION

The invention relates broadly to measurement of large currents and production of devices for that purpose.

BACKGROUND OF THE INVENTION

Fiber optic, current sensors, based on the Faraday effect, have a number of advantages for remotely measuring large electrical currents. These include wide dynamic range, fast response, immunity to electromagnetic interference, small size, and low cost. Consequently, a variety of fiber optic, current sensors have been investigated in recent years. Mainly, they have employed a single mode optical fiber (SMF) of clad silica.

These sensors have not yet reached the stage of practical field use due to lack of accuracy and stability. This is mainly due to intrinsic and induced, linear birefringences that distort the Faraday rotation being measured. A particular problem arises from the inability of silica fibers to measure accurately large currents, such as surge or fault currents. Such currents are exceptionally large, as much as 180 kA under some circumstances. They generally occur due to some failure, such as a short circuit.

The Faraday effect is a phenomenon by which a linear, polarized light will rotate when propagating through a transparent material that is placed in a magnetic field in parallel to the magnetic field. The size of the rotation angle ($\theta$), given in degrees, is defined as $$\theta = VHL \qquad (1)$$

where H is the strength of the magnetic field (A/m), V is the Verdet constant of the material, and L is the path length over which the magnetic field acts (m).

The magnetic field strength is measured in terms of Amperes (A) times turns (T) per unit length (AT/m) where m is meters). Since values are expressed in terms of one turn, this factor is usually implicit, rather than explicit. Hence, the strength is customarily given in amperes (A) or kiloamperes (kA) per unit path length in meters (m).

The Verdet constant, V, is the angle of rotation divided by the magnetic field strength per unit length. The angle may be expressed in any of the customary units for angle measurement, but degrees are used here. Verdet constant values, unless otherwise indicated, are given in terms of degrees divided by field strength expressed as (kA×T/m)m.

The magnitude of the magnetic induction (B) around an infinite straight conductor is given by the expression:

$$B = (\mu_o/4\pi)(2I/a) \qquad (2)$$

where I is the current, $\mu_o$ is permittivity of free space, and a is the radial distance of the magnetic field from the conductor. The magnetic field is related to the magnetic induction by the simple relation:

$$B = \mu_o H. \qquad (3)$$

Combining equations 1 through 3 gives a proportional relation between the rotation and the current such that:

$$\theta = VI \qquad (4)$$

where $\theta$ is in degrees, V is the Verdet constant, and I is in kiloamperes (kA). Thus, the sensitivity of a method for measuring the current depends on how accurately the angular rotation can be measured.

The degree of sensitivity in measuring the angular rotation is influenced by another factor; birefringence. Birefringence arises primarily from stresses that result from bending, or otherwise distorting, a fiber in its disposition. The sources of linear birefringence in single mode fibers include residual stress from fabrication, bending, contact, and thermal stresses (Yamashita et al., "Extremely Small Stress-optic Coefficient Glass Single Mode Fibers For Current Sensor", Optical Fiber Sensors, Sapporo Japan, paper We2-4, page 168 (1996) ("Yamashita").

The stress-induced birefringence is quantified in terms of a coefficient, called the photoelastic constant (or the photoelastic coefficient). The photoelastic coefficient ($B_p$) may be defined as the coefficient relating the difference in the refractive indices in the stress direction (n(par)) and in the pependicular direction (n(per)), to the magnitude of the applied stress:

$$n(\text{par}) - n(\text{per}) = B_p \sigma \qquad (5)$$

It may also be regarded as the phase shift measured in units of wavelength in nanometers (nm) per path length in centimeters (cm) divided by the stress in kilograms per square centimeter (kg/cma$^2$). The values then are in units of (nm/cm divided by kg/cm$^2$).

An ideal glass fiber would have a photoelastic coefficient of zero, thereby nullifying any effect of stress-induced birefringence. However, this has proven difficult to obtain in conjunction with other desired properties.

Therefore, a near-zero value, e.g., a value within a range of −0.2 to 0.2, has been considered adequate for some purposes.

In measuring a surge current, it is important to keep the angle of rotation below 90 degrees. With glass fibers having large Verdet constants, a fault current measurement is apt to create an angle of rotation greater than 90 degrees. The angle of rotation greater than 90 degrees will register the same as an angle of less than 90 degrees. In contrast, a device having a glass fiber with a low Verdet constant will not have as great an angle of rotation when measuring a large fault current. Therefore, it will accurately measure such currents.

It is a purpose of the present invention to provide an improved method and device for measuring large currents, such as surge and fault currents.

Another purpose is to provide a glass that is adapted to use in such improved method and device.

A further purpose is to provide a method of producing a glass having a near-zero photoelastic coefficient in conjunction with a low Verdet constant.

A still further purpose is to provide a method of reducing the photoelastic coefficient of a glass having a low Verdet constant.

SUMMARY OF THE INVENTION

The present invention resides in part in a method of reducing the photoelastic coefficient of a fluoride glass that has a low Verdet constant at a wavelength suitable for measurement, and that contains zirconium fluoride as a primary component of its composition, the method comprising the step of incorporating a small amount of lead fluoride in the glass composition.

The invention further resides in a method of determining the magnitude of a surge or fault current of up to about 200 kA which comprises:

providing a glass fiber, current sensor, the glass having a composition composed predominantly of zirconium fluoride and containing up to about 3% lead fluoride, having a low Verdet constant at the wavelength used for measurement, and capable of causing an angular rotation of polarized light less than 0.45° per kA, per pass at that wavelength, passing a current through a conductor to create a magnetic field surrounding the conductor, positioning the current sensor within the magnetic field thus created, propagating polarized light into the glass fiber, current sensor, measuring the angle of rotation of the polarized light in the glass fiber sensor, and determining the magnitude of the current from the angle of rotation of the polarized light.

DESCRIPTION OF THE DRAWINGS

The single FIGURE in the accompanying drawing is a device for carrying out the method according to the present invention.

DESCRIPTION OF THE INVENTION

Figure 1:
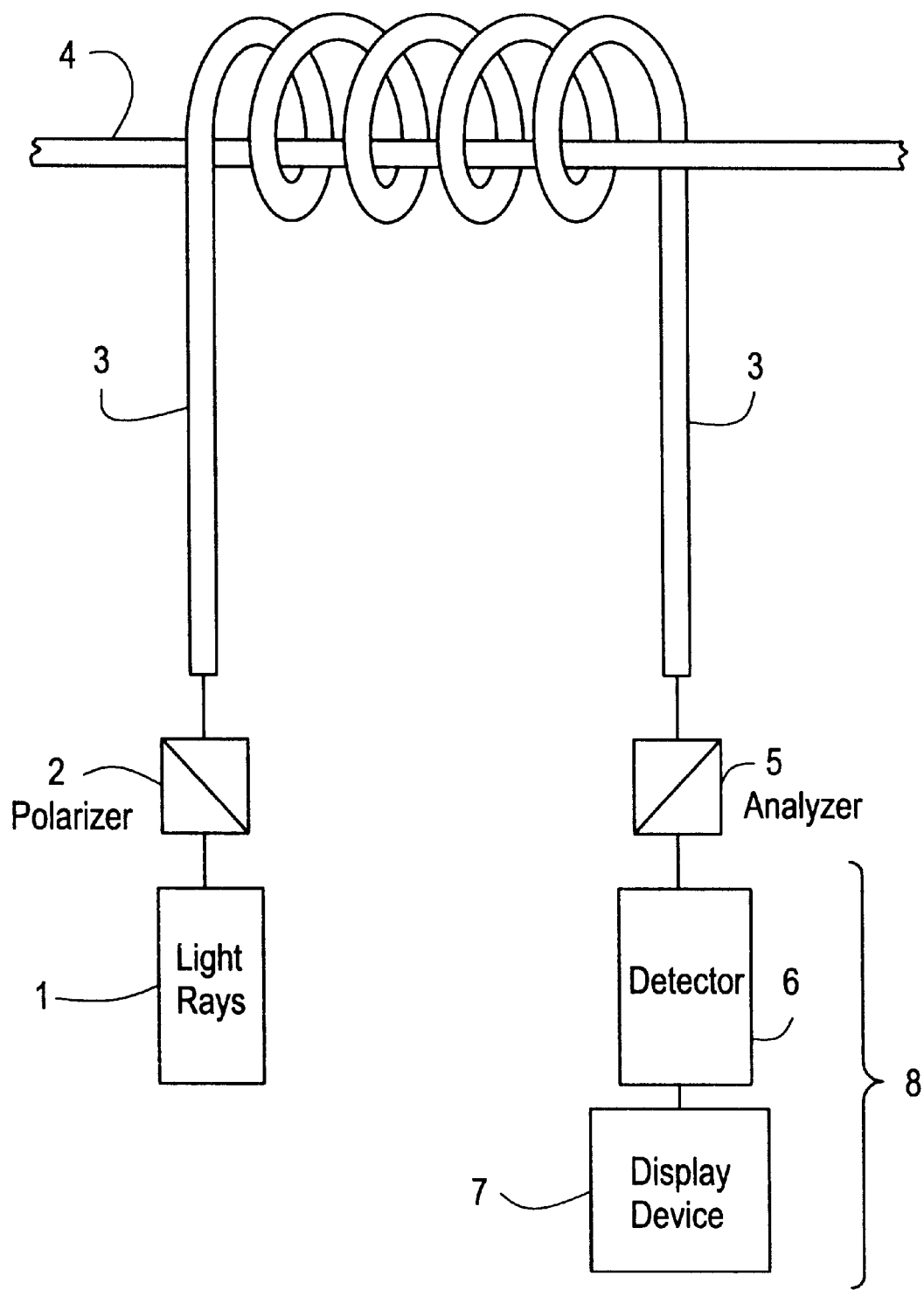

The present invention relates to a method and device for determining the magnitude of an exceptionally large current. The magnitude is determined by measuring the angle of rotation that the current creates in polarized light as the light is transmitted through a fiber in a magnetic field. The angle of rotation is less when the glass from which the fiber is drawn has a low Verdet constant. In particular, a fiber produced from a fluoride glass of the present invention will have a Verdet constant that is less than 0.45 degrees/kA. Therefore, when the fiber is exposed to a current up to at least 200 kA in magnitude, it will register an angle of rotation less than 90 degrees, and will accurately measure the current.

Reference to a fiber signifies a clad fiber comprising essentially a fiber core and an outer cladding layer. The fiber core is the functional member for current measurement. However, it is well known that a fiber core requires a cladding of lower refractive index to prevent loss of light from the core during transmission.

Except for refractive index, it is desirable that the properties of a cladding closely match those of a core glass in a clad fiber. Accordingly, it is common practice to use glasses of the same composition family for the core and cladding. The cladding glass will have the same composition as that of the core glass, except modified to impart a lower refractive index.

Lead fluoride ($PbF_2$) is added to a selected fluoride glass composition, in exchange for sodium fluoride (NaF), to produce a fiber core. A glass having the same composition, but with the $PbF_2$ omitted and the NaF restored, may be used as a cladding glass. Other exchanges, such as for barium fluoride and/or zinc fluoride, may be made to lower the index for a cladding glass. For example, NaF, or another alkaline earth metal fluoride, such as calcium or magnesium fluoride, may be exchanged for barium or zinc fluoride to provide a lower refractive index. The two glasses may be melted, and a clad fiber drawn employing the well-known double crucible technique.

FIG. 1 illustrates an embodiment of the device of the present invention. Preferably, a clad fiber 3, as described above, is utilized. However, any glass article, such as a piece of bulk glass (not shown), can be used. Fiber 3 acts as a path for the polarized light. Conductor 4 carries the current to produce a magnetic field. Preferably, fiber 3 is wrapped around conductor 4, as shown, to increase the length of the light path. Also, it is preferable that fiber 3 be insulated from the conductor.

The device also includes a source of light rays 1, the source being located such that light rays are directed to an input end of fiber 3. Typically, the source of light rays 1 is a laser. A polarizer 2 is located adjacent to source of light rays 1 such that the light rays are linearly polarized. An analyzer 5 is located at an output end of fiber 3.

Analyzer 5 derives a rotatory, polarization component produced in proportion to the current flowing through the conductor 4. Also included is a means 8 for indicating the measured current corresponding to the output of analyzer 5. Typically, the means 8 is a light detector 6, and a display device 7. Light detector 6 receives and detects the output of analyzer 5. Device 7 receives the output of, and provides a display of, the output of the light detector 6.

Optionally, the analyzer may be a Wollaston prism, as described in Yamashita. Then, the light ray output from the fiber is broken into two orthogonal polarizations. Means 8 detects the output of each signal, and indicates the measured current corresponding to the output.

Electrical current, in a normal power station operation, can be determined by employing a glass current sensor, preferably in the form of a clad fiber. In order to avoid the effect of birefringence, it is desirable to employ a glass having a low photoelastic coefficient, preferably zero or near-zero. The Verdet constant of the glass may then ordinarily be as large as possible to enhance the sensitivity of the determination. In measuring exceptionally large currents, as explained earlier, a low Verdet constant is now required. This avoids pushing the angle of rotation of the polarized light beyond 90°.

Heretofore, fused silica has provided the smallest Verdet constant available in an inorganic glass, the value being 0.1°/kA at 1150 nm. However, fused silica also has a large photoelastic coefficient, 3.5 $(nm/cm)/(kg/cm^2)$ at 560 nm. This has led to a search for a glass of comparable Verdet constant and a low, near-zero photoelastic coefficient.

It has been observed that certain fluoride glasses have relatively small photoelastic coefficients. Further, these glasses may also have small Verdet constants. Particular reference is made to a fluoride glass known by the acronym ZBLAN. This glass is reported to have a composition consisting of, in mole percent, 53 $ZrF_4$, 20 $BaF_2$, 4 $LaF_3$, 3 $AlF_3$ and 20 NaF. Measurements on this glass show a desirably low Verdet constant of 0.22°/kA at 633 nm., and a photoelastic coefficient of 0.34 $(nm/cm)/(kg/cm^2)$ at 546 nm.

In order to measure exceptionally large currents, an even lower photoelastic coefficient is desirable. We have found that lead fluoride ($PbF_2$) can be added to a ZBLAN-type glass composition in an amount up to about 3 mol %. Preferably, the addition is in substitution for sodium fluoride (NaF).

We have further found that such additions result in glasses having decreased photoelastic coefficients. Based on these findings, core fibers for present purposes preferably consist essentially of, as calculated in mol %:

| | |
|---|---|
| 52–56% | $ZrF_4$ |
| 14–24% | $BaF_2$ |
| 3–6% | $LaF_3$ |
| 3–6% | $AlF_3$ |
| 14–22% | NaF |
| up to about 3% | $PbF_2$ |

SPECIFIC EMBODIMENTS

Three glasses were prepared based on the ZBLAN composition. In two of the glass compositions, a small amount of lead fluoride ($PbF_2$) was substituted for sodium fluoride (NaF). Otherwise, the ZBLAN composition was unchanged.

Measurements were made of Verdet coefficient at 633 nm, and at 1150 nm for one glass, and photoelastic coefficient (B) at 546 nm. TABLE I shows the $PbF_2$ content in mole and weight % and the measured values for Verdet and photoelastic coefficients.

TABLE I

| $PbF_2$ | | | | |
|---|---|---|---|---|
| mole % | weight % | V (633 nm) | V (1150 nm) | B (546 nm) |
| 0.0 | 0.0 | 0.22 | — | 0.34 |
| 0.7 | 1.43 | 0.22 | 0.12 | 0.25 |
| 2.0 | 4.28 | 0.20 | — | 0.18 |

These data indicate that increasing $PbF_2$ substitutions will provide a photoelastic coefficient approaching zero. However, the compositions become increasingly difficult to melt.

The glasses shown in TABLE I were prepared by mixing an appropriate batch of fluoride components, placing the batch in a covered, platinum crucible to retain fluorine, and melting at 800° C. for about 40 minutes. The crucible was then uncovered, and the melt was heat treated for 2–3 hours while being covered with gaseous sulfur hexafluoride. The melts were then poured into molds heated at 260° C. and the glasses annealed at that temperature. The annealed glasses were clear, and test pieces were prepared for measurements as recorded in TABLE I.

We claim:

1. A method for measuring a magnitude of an exceptionally large current of up to about 200 kA, the method comprising the steps of:
    providing a glass fiber current sensor having a core glass composition composed predominantly of zirconium fluoride and containing up to about 3 mole % lead fluoride, the glass fiber current sensor further having a low Verdet constant at a wavelength used for the measurement and being capable of causing an angular rotation of polarized light less than 0.45° per kA per pass at the wavelength;
    providing a conductor;
    passing the current through the conductor to create a magnetic field surrounding the conductor;
    positioning the glass fiber current sensor within the magnetic field;
    propagating a polarized light into the glass fiber current sensor;
    measuring the angle of rotation of the polarized light in the glass fiber current sensor; and
    determining the magnitude of the current from the angle of rotation of the polarized light.

2. The method of claim 1 in which the glass fiber current sensor forms a coil, the conductor extending through the coil.

3. The method of claim 1 wherein the glass fiber current sensor has a photoelastic coefficient not over 0.25 (nm/cm)/($kg/cm^2$).

* * * * *